(12) United States Patent
Wei

(10) Patent No.: US 9,491,888 B2
(45) Date of Patent: *Nov. 8, 2016

(54) ELECTRONIC DEVICE

(71) Applicant: WISTRON CORP., New Taipei (TW)

(72) Inventor: Ren-Jing Wei, New Taipei (TW)

(73) Assignee: Wistron Corp., New Taipei (TW)

( * ) Notice: Subject to any disclaimer, the term of this patent is extended or adjusted under 35 U.S.C. 154(b) by 127 days.

This patent is subject to a terminal disclaimer.

(21) Appl. No.: 14/079,563

(22) Filed: Nov. 13, 2013

(65) Prior Publication Data

US 2014/0063706 A1   Mar. 6, 2014

Related U.S. Application Data

(63) Continuation of application No. 13/156,261, filed on Jun. 8, 2011, now Pat. No. 8,773,353.

(30) Foreign Application Priority Data

Jun. 9, 2010 (TW) .............................. 99118672 A

(51) Int. Cl.
```
G06F 3/0362     (2013.01)
H05K 7/16       (2006.01)
G06F 1/16       (2006.01)
```

(52) U.S. Cl.
CPC .............. *H05K 7/16* (2013.01); *G06F 1/1662* (2013.01); *G06F 1/1675* (2013.01)

(58) Field of Classification Search
USPC ...................... 345/184; 248/371, 372.1, 395
See application file for complete search history.

(56) References Cited

U.S. PATENT DOCUMENTS

| | | | | |
|---|---|---|---|---|
| 5,982,612 A * | 11/1999 | Roylance | ............. | G06F 1/1622 361/679.08 |
| 8,773,353 B2 * | 7/2014 | Wei | ....................... | G06F 1/1662 345/156 |
| 2004/0058703 A1 * | 3/2004 | Eromaki | ............... | G06F 1/1616 455/550.1 |
| 2007/0289099 A1 * | 12/2007 | Jung | ..................... | G06F 1/1616 16/354 |
| 2009/0273564 A1 * | 11/2009 | Glaser-Seidnitzer | . | G06F 3/0213 345/161 |
| 2011/0216483 A1 * | 9/2011 | Vesely | ................... | B60N 3/004 361/679.01 |

* cited by examiner

*Primary Examiner* — Ilana Spar
*Assistant Examiner* — Jeffrey S Steinberg

(57) ABSTRACT

An electronic device is provided. The electronic device includes a housing, an input device, a sliding groove and an actuating unit. The input device is disposed on the housing, wherein the input device includes a first input interface and a second input interface, and the first input interface and the second input interface are respectively disposed on opposite surfaces of the input device. The sliding groove is formed on the housing. The actuating unit is connected to the input device, the actuating unit automatically moves between a first position and a second position of the sliding groove to rotate the input device, the first input interface faces outward from the housing when the actuating unit is in the first position, and the second input interface faces outward from the housing when the actuating unit is in the second position.

15 Claims, 12 Drawing Sheets

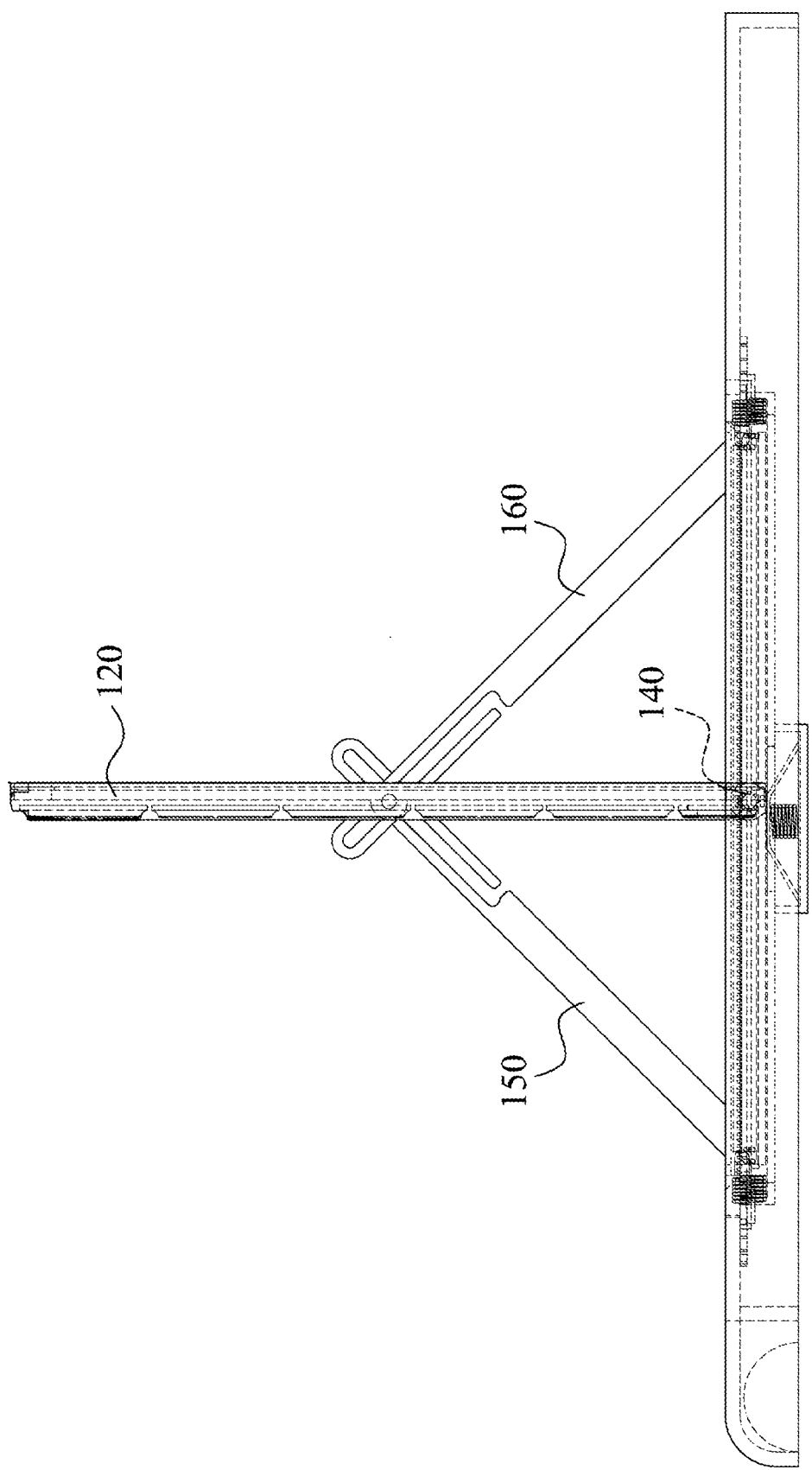

ELECTRONIC DEVICE

CROSS REFERENCE TO RELATED APPLICATIONS

This Application is a Continuation of U.S. patent application Ser. No. 13/156,261, filed Jun. 8, 2011 and entitled "Electronic device", which claims priority of Taiwan Patent Application No. 099118672, filed on Jun. 9, 2010, the entirety of which are incorporated by reference herein.

BACKGROUND OF THE INVENTION

1. Field of the Invention

The present invention relates to an electronic device, and in particular relates to an electronic device with a rotatable input device.

2. Description of the Related Art

For a conventional notebook, a handwriting recognition device and a keyboard are separately disposed on a body of the notebook. As the dimension of notebooks decreasing, the space of an upper surface of the body of a notebook is no longer sufficient for disposing a handwriting recognition device and a keyboard.

BRIEF SUMMARY OF THE INVENTION

An electronic device is provided. The electronic device includes a housing, an input device, a sliding groove and an actuating unit. The input device is disposed on the housing, wherein the input device includes a first input interface and a second input interface, and the first input interface and the second input interface are respectively disposed on opposite surfaces of the input device. The sliding groove is formed on the housing. The actuating unit is connected to the input device, the actuating unit is automatically moved between a first position and a second position of the sliding groove to rotate the input device, the first input interface faces outward from the housing when the actuating unit is in the first position, and the second input interface faces outward from the housing when the actuating unit is in the second position.

In the embodiment of the invention, the actuating unit moves automatically to push and to rotate the input device. The input device is therefore rotated automatically to exchange the positions of the first and second input interfaces. Thus, the dimensions of the electronic device can be further reduced.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2B and 2C show the actuating unit of the first embodiment of the invention moving between the first position and a second position;

DETAILED DESCRIPTION OF THE INVENTION

The following description is part of the embodiments of carrying out the invention. This description is made for the purpose of illustrating the general principles of the invention and should not be taken in a limiting sense.

Figure 1A:
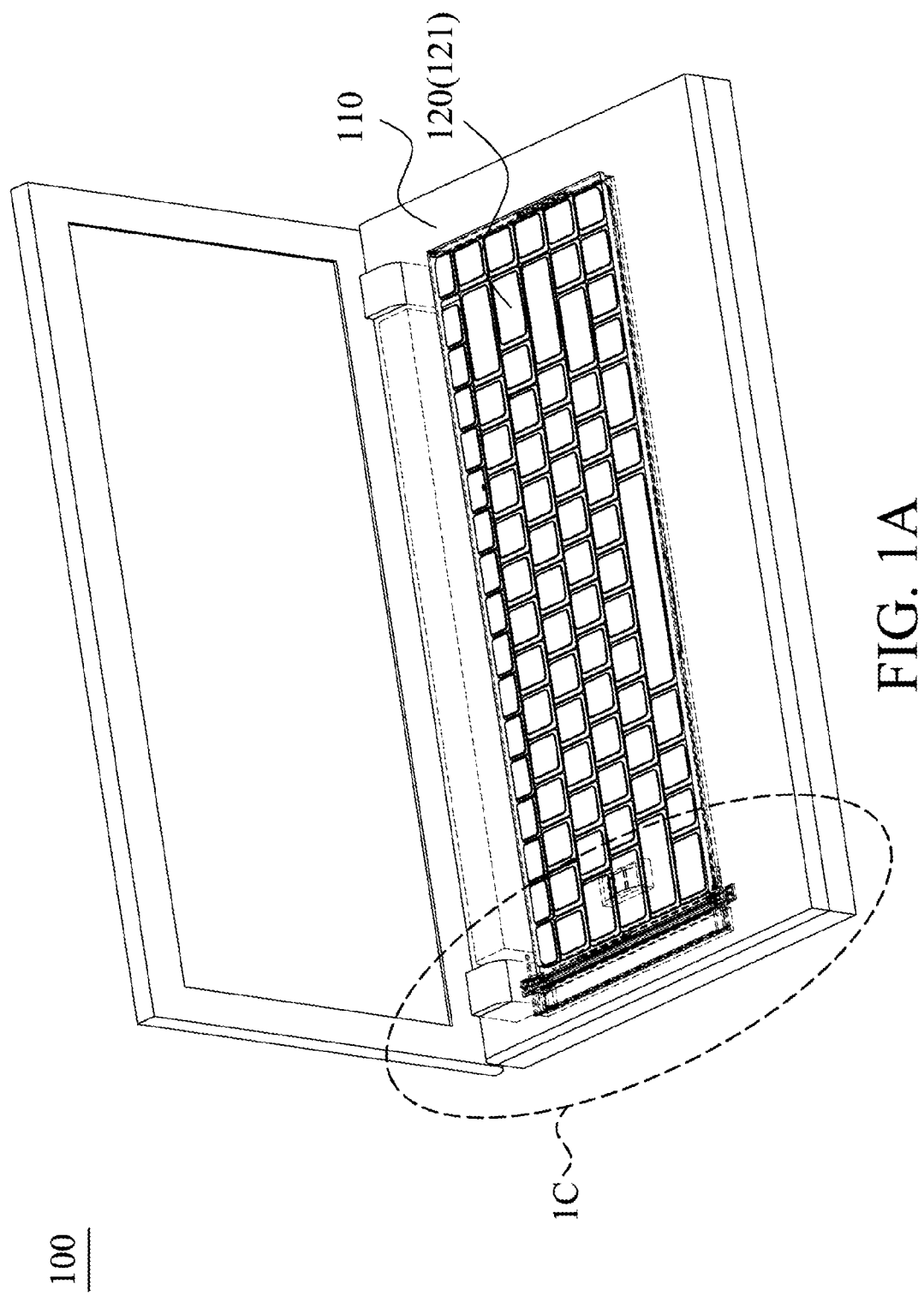
FIG. 1A is an assembly view of an electronic device of an embodiment of the invention.
Figure 1B:
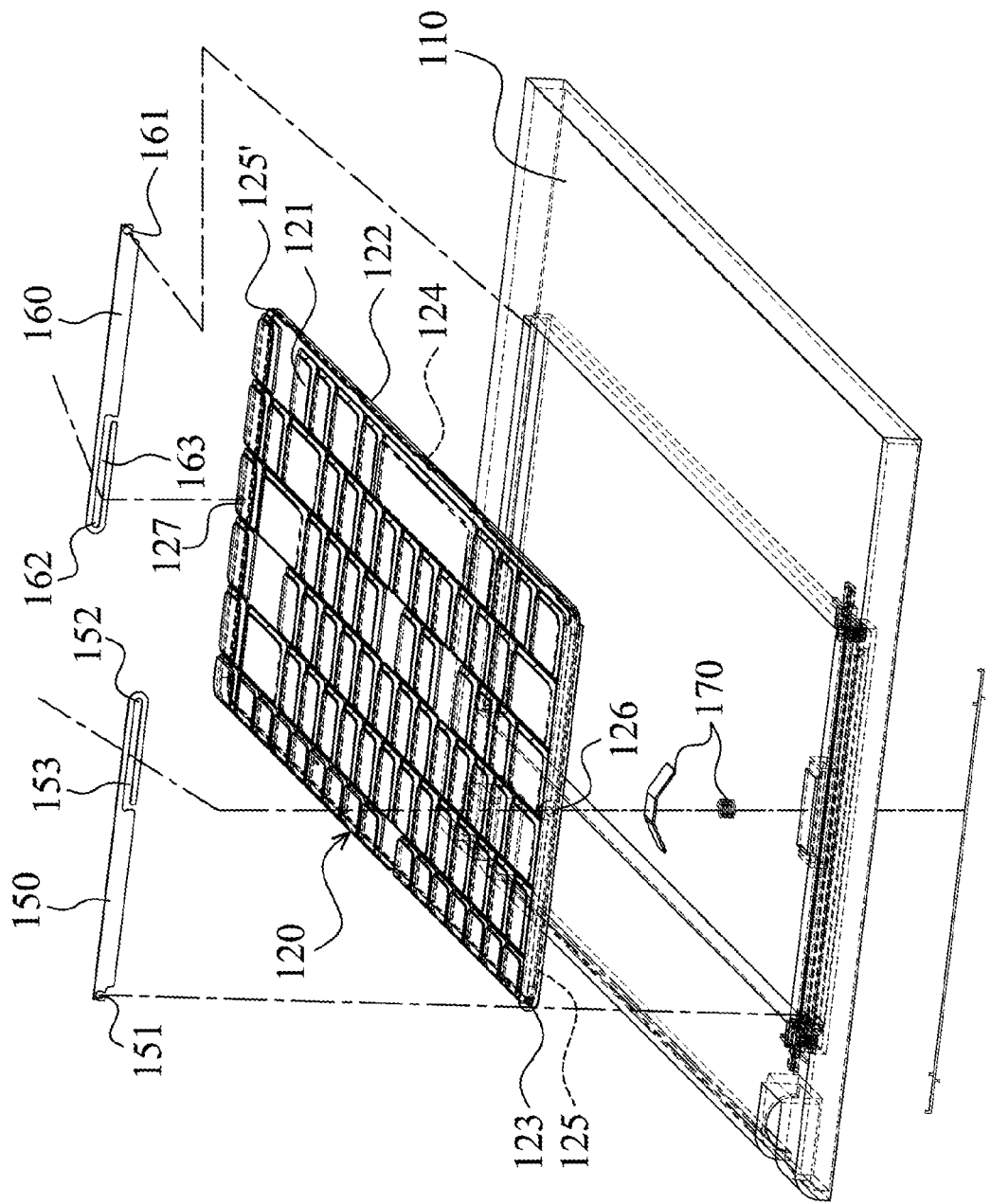
FIG. 1B is an exploded view of portion of body of the electronic device of a first embodiment of the invention.
Figure 1C:
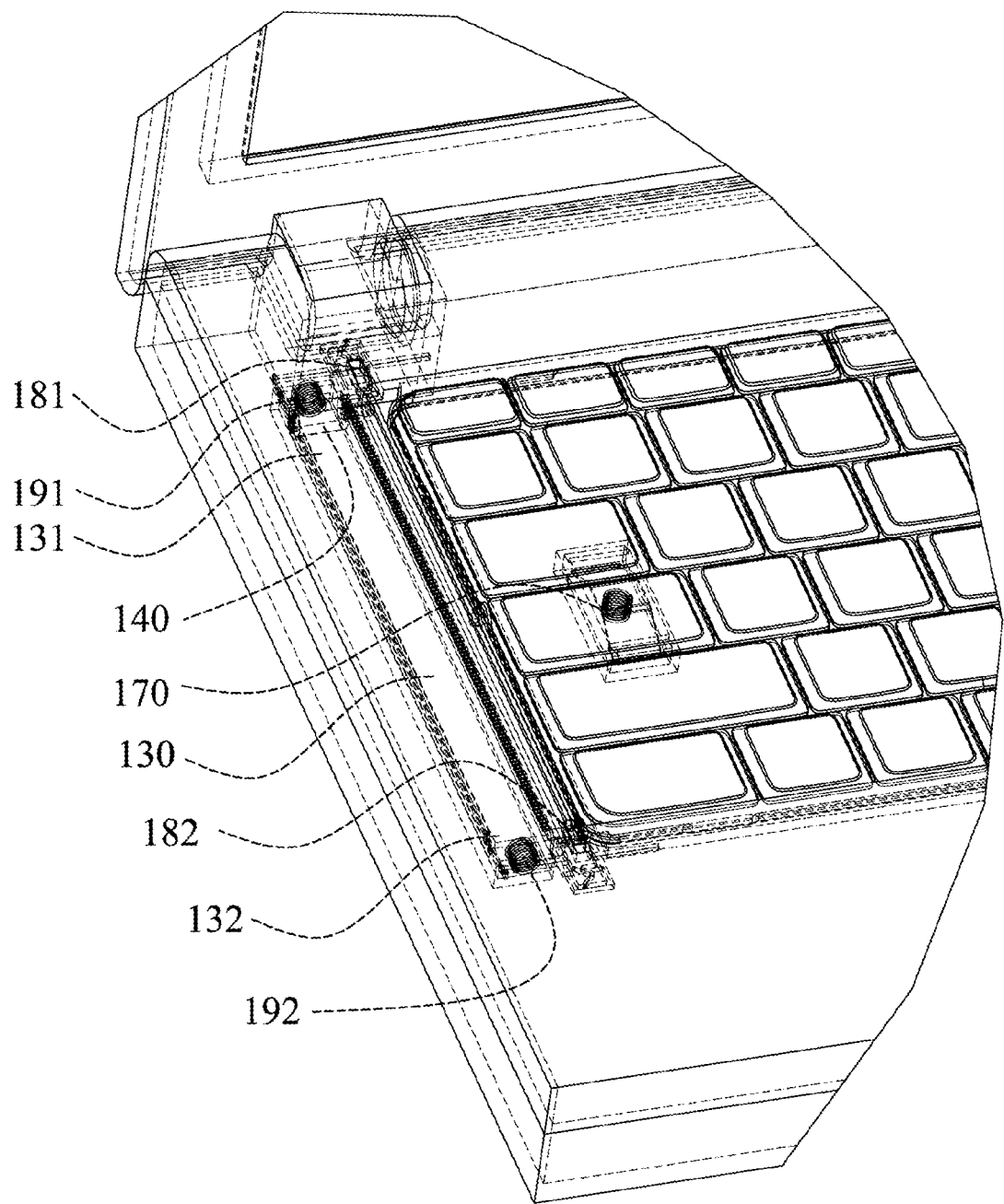
FIG. 1C is an enlarged view of portion 1C in FIG. 1A.

With reference to FIGS. 1A, 1B and 1C, FIG. 1A is an assembly view of the electronic device 100 of a first embodiment of the invention, FIG. 1B is an exploded view of portion of body of the electronic device 100 of the first embodiment of the invention, and FIG. 1C is an enlarged view of portion 1C in FIG. 1A. The electronic device 100 comprises a housing 110, an input device 120, a sliding groove 130 and an actuating unit 140. The input device 120 is disposed on the housing 110. The input device 120 includes a first input interface 121 and a second input interface 122, while the first input interface 121 and the second input interface 122 are respectively disposed on opposite surfaces of the input device 120. The sliding groove 130 is formed on the housing 110. The actuating unit 140 is connected to the input device 120, and the actuating unit 140 moves automatically between a first position 131 and a second position 132 of the sliding groove 130 to rotate the input device 120. When the actuating unit 140 is in the first position 131, the first input interface 121 faces outward from the housing 110. When the actuating unit 140 is in the second position 132, the second input interface 122 faces outward from the housing 110 (reference FIGS. 2A~2D, which show the rotation of the input device 120).

In the first embodiment above, the first input interface 121 includes a keyboard, and the second input interface 122 includes a handwriting recognition device. In the first embodiment of the invention, the actuating unit 140 moves automatically to push and to rotate the input device 120. The input device 120 is therefore rotated automatically to exchange the positions of the first and second input interfaces. Thus, the dimensions of the electronic device can be further reduced.

With reference to FIGS. 1B and 1C, the electronic device 100 further includes an abutting mechanism 170, a first limit element 181 and a second limit element 182. The first limit element 181 is disposed on the housing 110 and is close to the first position 131, the second limit element 182 is disposed on the housing 110 and is close to the second position 132 (reference FIGS. 3A and 3B). The first limit element 181 and the second limit element 182 abut the input device 120 to limit the movement of the input device 120. The abutting mechanism 170 is disposed in the housing 110 to push and to rotate the input device 120. In this embodiment, the electronic device 100 further includes a first elastic element 191 and a second elastic element 192 (reference FIGS. 3A and 3B), wherein the first elastic element 191 is disposed in the first position 131, and the second elastic element 192 is disposed in the second position 132.

Figure 2A:
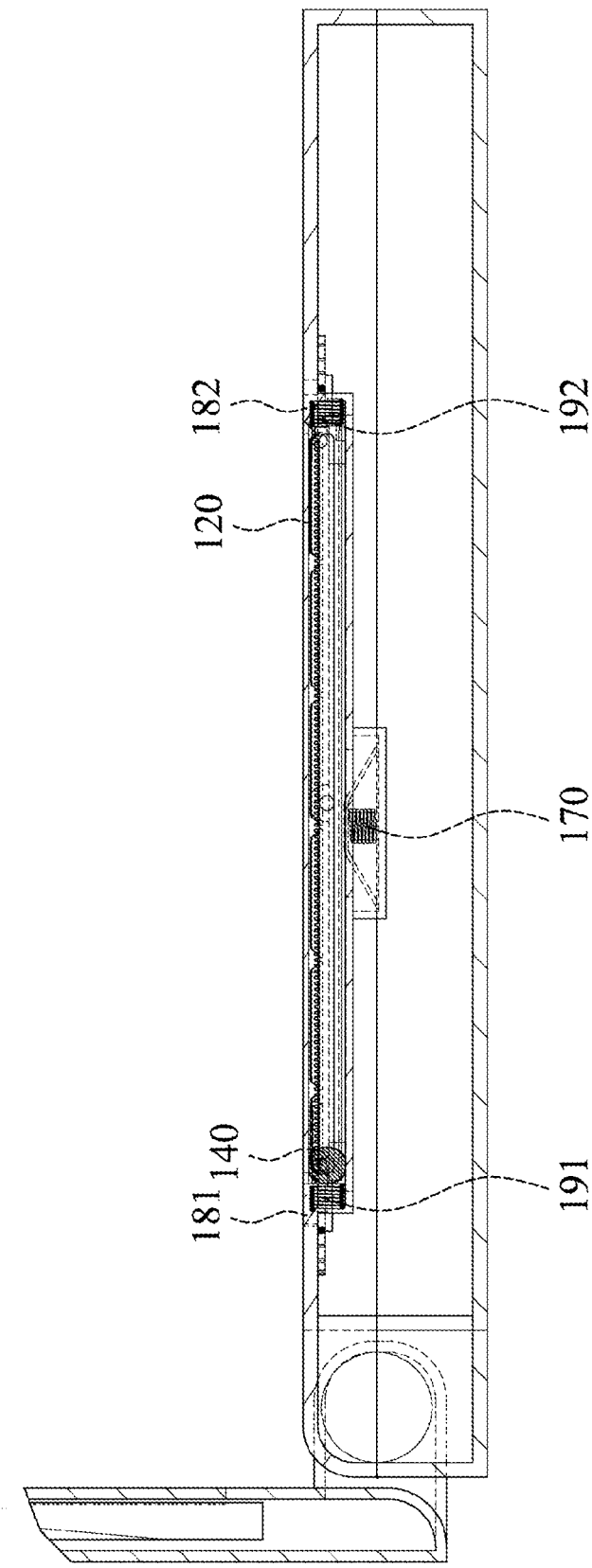
FIG. 2A shows an actuating unit of the first embodiment of the invention located in a first position.
Figure 2B:
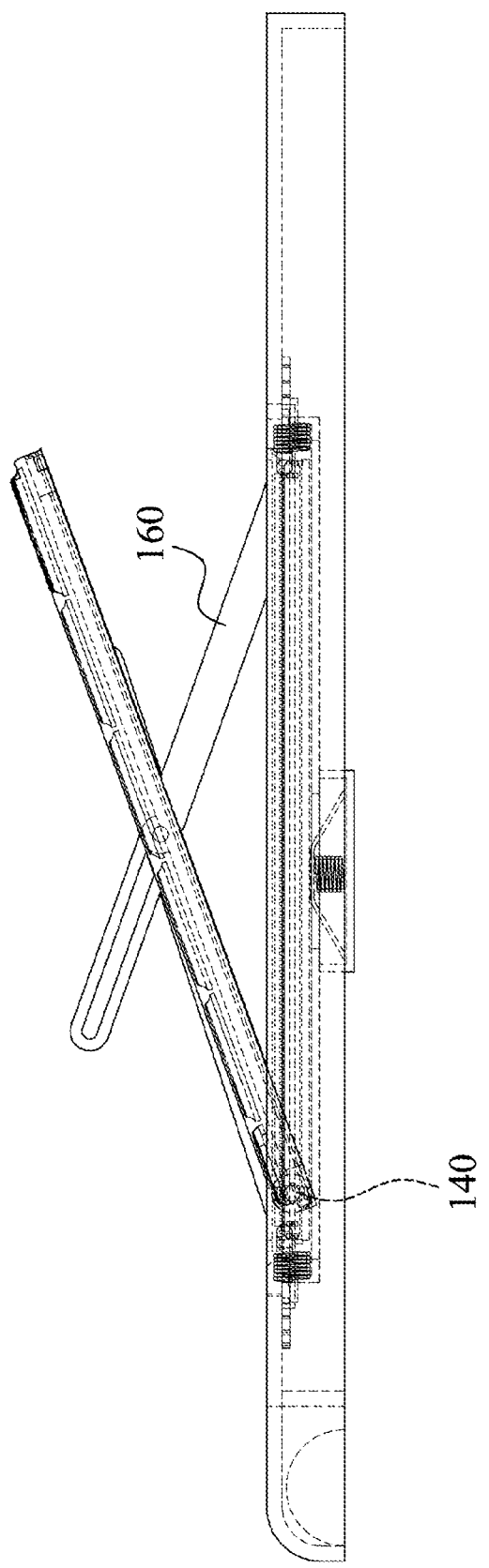
Figure 2D:
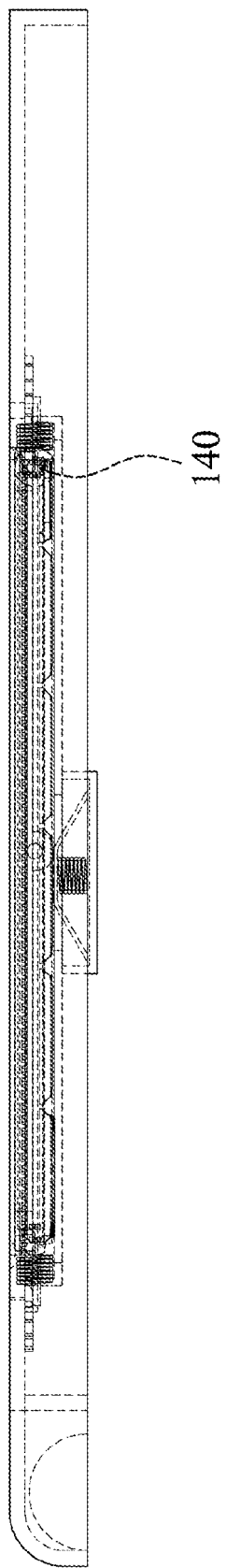
FIG. 2D shows the actuating unit of the first embodiment of the invention located in the second position.

With reference to FIGS. 2A and 2B, when the second limit element 182 releases the input device 120, the abutting mechanism 170 pushes the input device 120 via elastic force, the first elastic element 191 pushes the actuating unit 140 from the first position toward the second position, and the actuating unit 140 is actuated to move toward the second position automatically (FIGS. 2B and 2C). Finally, with reference to FIG. 2D, the actuating unit 140 arrives at the second position, and the input device 120 is limited and positioned by the first limit element 181. Similarly, when the first limit element 181 releases the input device 120, the abutting mechanism 170 pushes the input device 120 via elastic force, the second elastic element 192 pushes the actuating unit 140 from the second position toward the first position, and the actuating unit 140 is actuated to move toward the first position automatically. Finally, the actuating unit 140 arrives at the first position, and the input device 120 is limited and positioned by the second limit element 182.

Figure 3A:
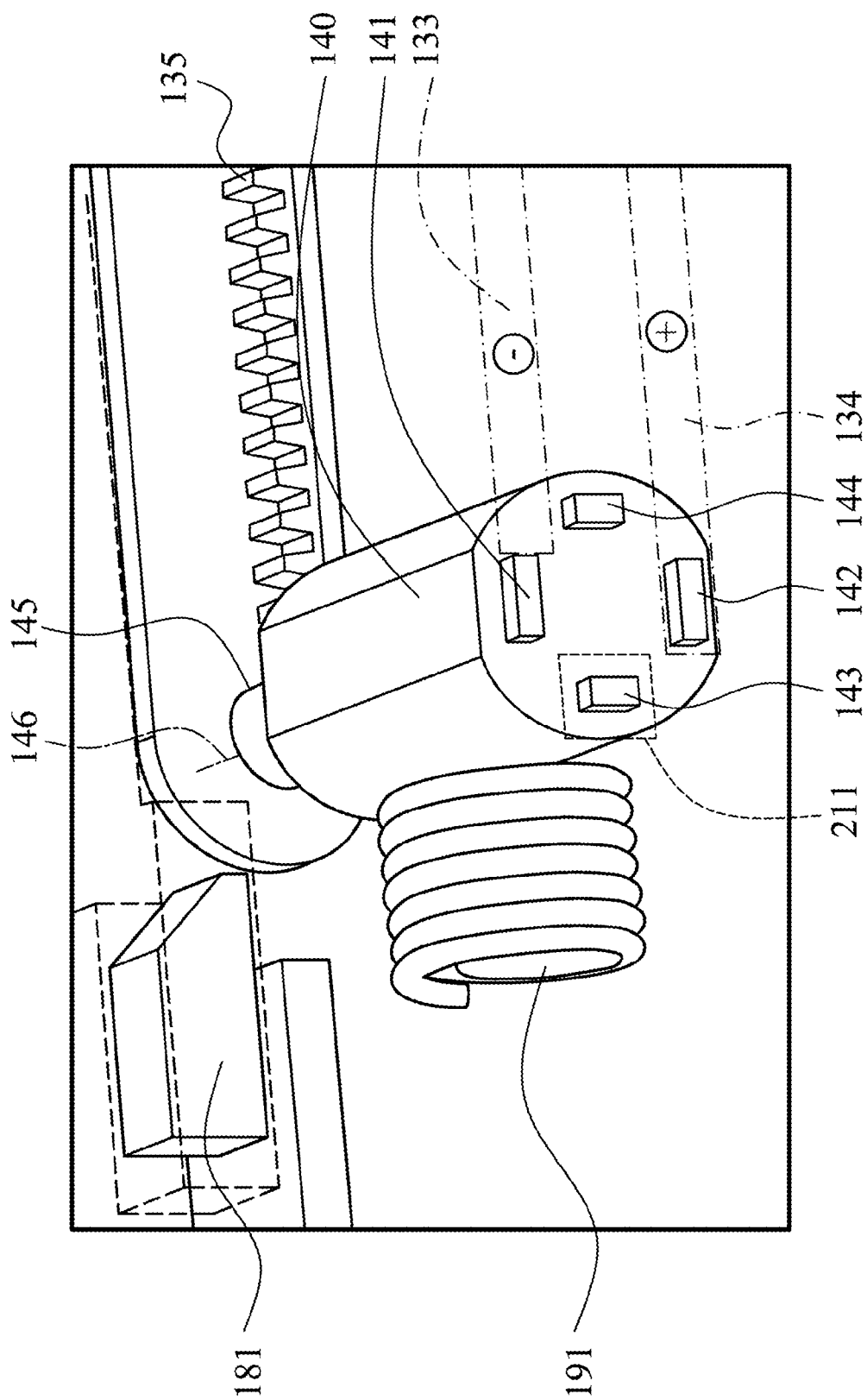
FIG. 3A shows detailed structure of the actuating unit when the actuating unit is in the first position.
Figure 3B:
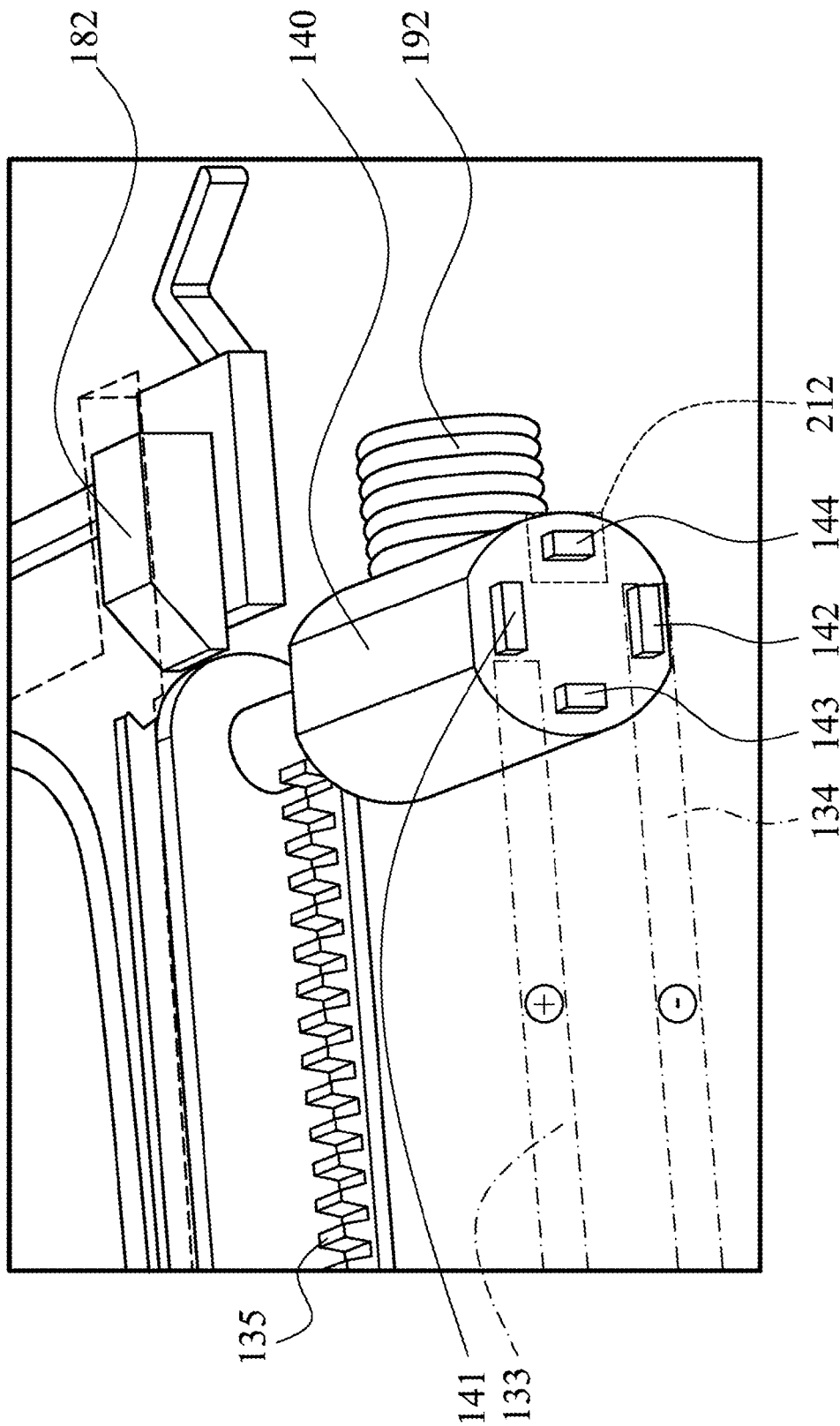
FIG. 3B shows detailed structure of the actuating unit when the actuating unit is in the second position.

With reference to FIGS. 3A and 3B, the actuating unit 140 moves along a rack 135.

With reference to FIG. 1B, the input device 120 includes a connection end 123, a free end 124, a lateral surface 125 and a lateral surface 125'. The actuating unit 140 is connected to the lateral surface 125 and is close to the connection end 123. The electronic device 100 further includes a first rod 150 and a second rod 160 for assisting the rotation of the input device 120. An end 151 of the first rod 150 pivots on the housing 110 close to the first position, the other end 152 of the first rod 150 is connected to the input device 120, an end 161 of the second rod 160 pivots on the housing 110 close to the second position, and the other end 162 of the second rod 160 is connected to the input device 120.

The input device 120 includes a connection portion 126 and a connection portion 127. The connection portion 126 is located on the lateral surface 125 and between the connection end 123 and the free end 124 (for example, in the center therebetween) for connection to the first rod 150. The connection portion 127 is located on the lateral surface 125' and between the connection end 123 and the free end 124 (for example, in the center therebetween) for connection to the second rod 160. In a modified example, the first rod 150 and the second rod 160 can also be connected to the same connection portion.

The first rod 150 has a first groove 153, and the second rod 160 has a second groove 163. The connection portion 126 slides in the first groove 153, and the connection portion 127 slides the second groove 163.

With reference to FIGS. 2A~2D, during the rotation of the input device 120, the first rod 150 and the second rod 160 are raised to provide lateral support for the input device 120.

In one embodiment, the first rod 150 has a pivot portion (end 151), the first rod 150 pivots on the housing 110 via the pivot portion (end 151), the actuating unit 140 has a fixing portion 145 and a pivot axis 146 (reference FIG. 3A), the actuating unit 140 is connected to the input device 120 via the fixing portion 145, the pivot axis 146 passes through the fixing portion 145, and a gap is formed between the pivot axis 146 and the pivot portion (end 151) when the actuating unit 140 is in the first position.

The direction switching method of the actuating unit 140 is described in the following description.

With reference to FIGS. 3A and 3B, the actuating unit 140 is a motor. The actuating unit 140 includes a first motor electrode 141, a second motor electrode 142, a first switch mechanism 143 and a second switch mechanism 144. The groove 130 includes a first conductive portion 133 and a second conductive portion 134. The first motor electrode 141 and the second motor electrode 142 of the actuating unit 140 are electrically connected to the first conductive portion 133 and the second conductive portion 134.

Figure 3C:
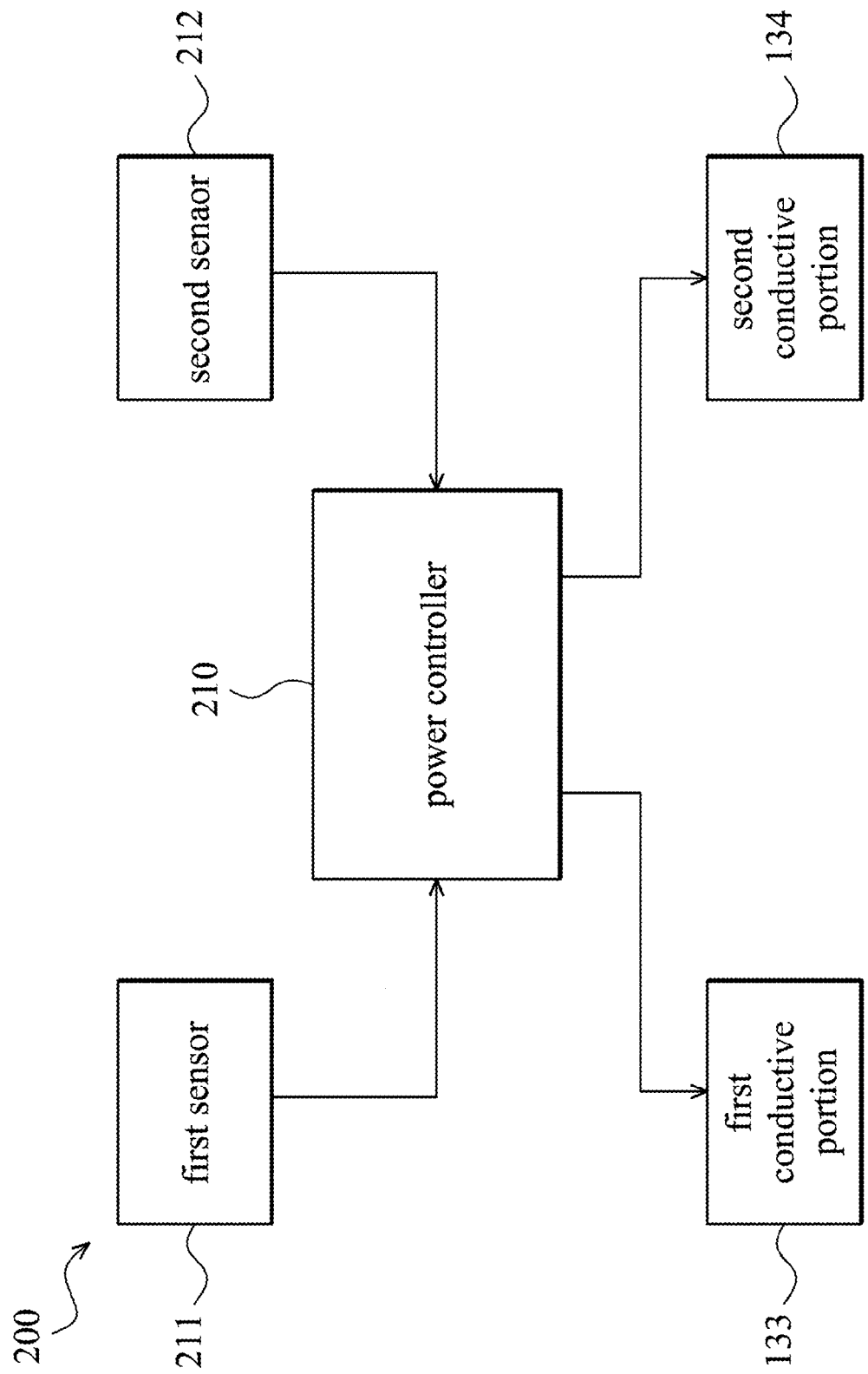
FIG. 3C is a block diagram of a direction control unit of the first embodiment of the invention.

With reference to FIG. 3C, the electronic device 100 further includes a direction control unit 200. The direction control unit 200 includes a first sensor 211, a second sensor 212 and a power controller 210. The power controller 210 is electrically connected to the first sensor 211, the second sensor 212, the first conductive portion 133 and the second conductive portion 134. With reference to FIG. 3A, when the actuating unit 140 is in the first position, a first switching mechanism 143 of the actuating unit 140 actuates the first sensor 211 to generate a first position signal. With reference to FIG. 3B, when the actuating unit 140 is in the second position, a second switching mechanism 144 of the actuating unit 140 actuates the second sensor 212 to generate a second position signal. The power controller 210 changes polarities of the first conductive portion 133 and the second conductive portion 134 according to the first position signal and the second position signal to control movement of the actuating unit 140.

Figure 4A:
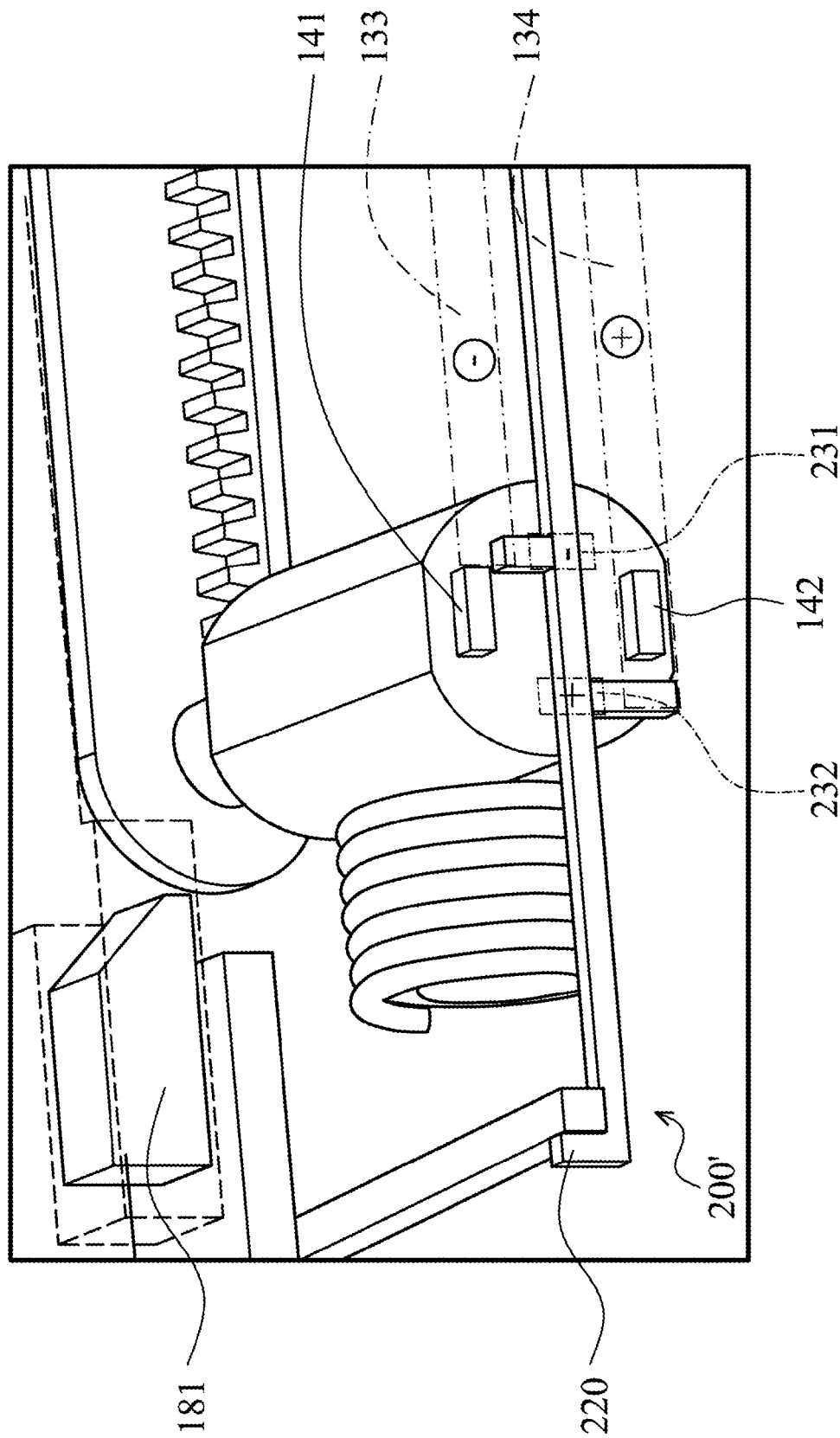
FIG. 4A shows detailed structure of the actuating unit when the actuating unit is in the first position in a second embodiment of the invention.
Figure 4B:
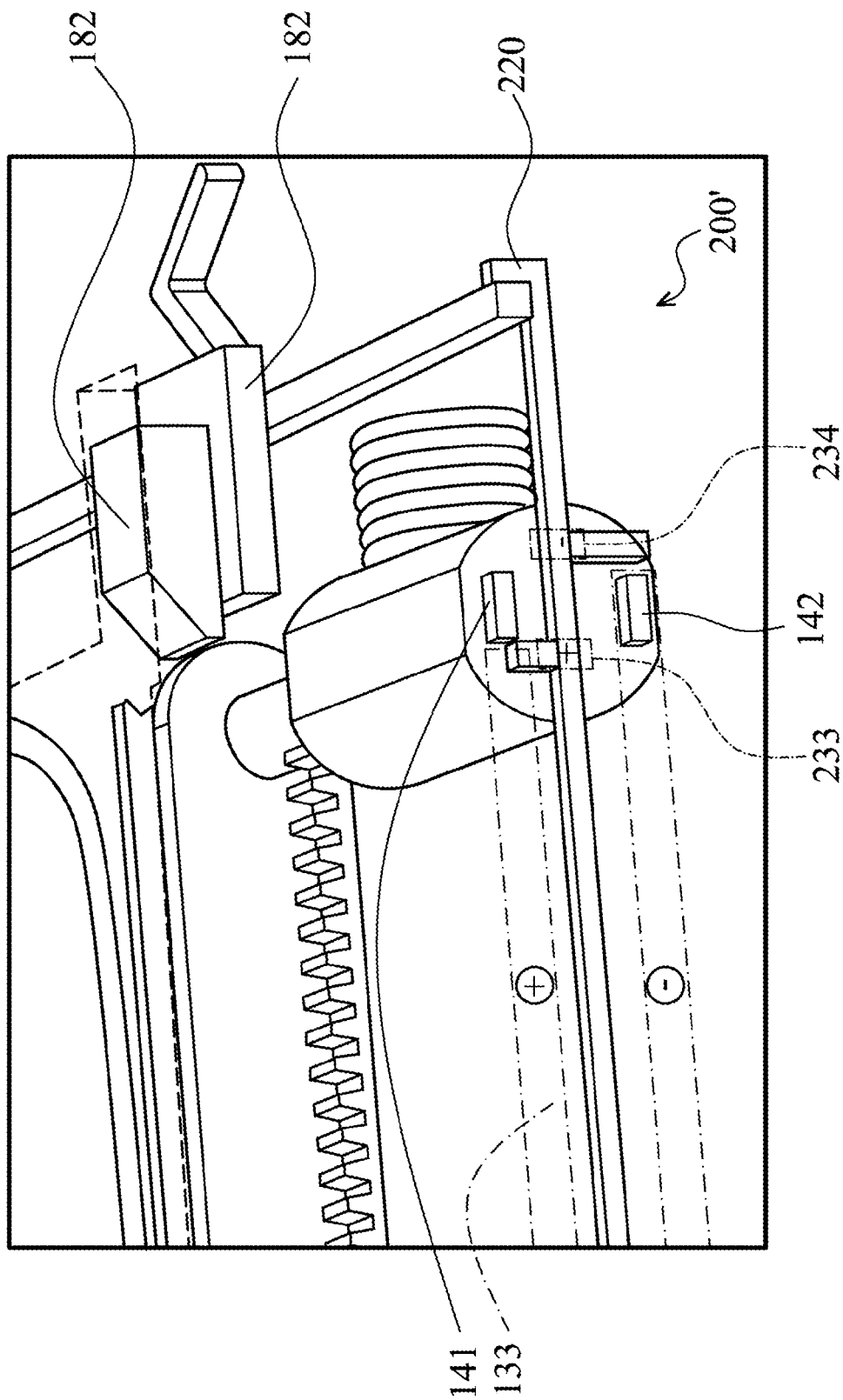
FIG. 4B shows detailed structure of the actuating unit when the actuating unit is in the second position in the second embodiment of the invention.

In a second embodiment, the moving direction of the actuating unit 140 is switched mechanically. FIGS. 4A and 4B show an electronic device of the second embodiment of the invention, including a direction control unit 200'. The direction control unit 200' includes a conductive rod 220, a first electrode 231, a second electrode 232, a third electrode 233 and a fourth electrode 234. The conductive rod 220 is moved between a first conductive rod position (FIG. 4A) and a second conductive rod position (FIG. 4B). The polarity of the second electrode 232 is opposite to the first electrode 231. The polarity of the fourth electrode 234 is opposite to the third electrode 233.

With reference to FIG. 4A, when the second limit element 182 releases the input device 120, the second limit element 182 pushes the conductive rod 220 to the first conductive rod position, the conductive rod 220 connects the first electrode 231 to the first conductive portion 133 and connects the second electrode 232 to the second conductive portion 134, and the actuating unit 140 therefore moves from the first position to the second position.

With reference to FIG. 4B, when the first limit element 181 releases the input device 120, the first limit element 181 pushes the conductive rod 220 to the second conductive rod position, the conductive rod 220 connects the third electrode 233 to the first conductive portion 133 and connects the fourth electrode 234 to the second conductive portion 134, and the actuating unit 140 therefore moves from the second position to the first position. Polarities of the first conductive portion and the second conductive portion are changed by the conductive rod to control movement of the actuating unit 140.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. An electronic device, comprising:
  a housing;

an input device, disposed on the housing, wherein the input device comprises:
  a body comprising a first surface, a second surface, and a lateral surface joining the first and second surfaces, wherein the first and second surfaces are oppositely facing sides of the body;
  a first input interface; and
  a second input interface, wherein the first input interface and the second input interface are respectively disposed on the first and second surfaces;
a sliding groove, formed on the housing; and
an actuating unit, wherein the actuating unit is connected to the input device and automatically moves between a first position and a second position of the sliding groove to rotate the input device relative to the housing, wherein the first input interface and the second input interface remain facing in opposite directions during rotation of the input device, and the first input interface faces outward from the housing when the actuating unit is in the first position, and the second input interface faces outward from the housing when the actuating unit is in the second position.

2. The electronic device as claimed in claim 1, wherein the input device has a connection end and a free end, and the actuating unit is connected to the lateral surface and is close to the connection end.

3. The electronic device as claimed in claim 1, further comprising a first rod and a second rod, wherein an end of the first rod pivots on the housing close to the first position, the other end of the first rod is connected to the input device, an end of the second rod pivots on the housing close to the second position, and the other end of the second rod is connected to the input device.

4. The electronic device as claimed in claim 1, wherein the input device further comprises at least one connection portion located on the lateral surface, between the connection end and the free end for connecting to the first rod or the second rod.

5. The electronic device as claimed in claim 4, wherein the first rod has a first groove, the second rod has a second groove, and the connection portion slides in the first groove or the second groove.

6. The electronic device as claimed in claim 3, wherein the first rod has a pivot portion, the first rod pivots on the housing via the pivot portion, the actuating unit has a fixing portion and a pivot axis, the actuating unit is connected to the input device via the fixing portion, the pivot axis passes through the fixing portion, and a gap is formed between the pivot axis and the pivot portion when the actuating unit is in the first position.

7. The electronic device as claimed in claim 1, further comprising an abutting mechanism, a first limit element and a second limit element, wherein the first limit element is disposed on the housing and is close to the first position, the second limit element is disposed on the housing and is close to the second position, the first limit element and the second limit element abut the input device to limit movement of the input device, and the abutting mechanism is disposed in the housing to push and to rotate the input device.

8. The electronic device as claimed in claim 7, wherein when the second limit element releases the input device, the abutting mechanism pushes the input device to move the actuating unit from the first position toward the second position.

9. The electronic device as claimed in claim 7, wherein when the first limit element releases the input device, the abutting mechanism pushes the input device to move the actuating unit from the second position toward the first position.

10. The electronic device as claimed in claim 7, wherein the abutting mechanism pushes the input device by elastic force.

11. The electronic device as claimed in claim 7, further comprising a first elastic element and a second elastic element, wherein the first elastic element pushes the actuating unit from the first position toward the second position when the second limit element releases the input device, and the second elastic element pushes the actuating unit from the second position toward the first position when the first limit element releases the input device.

12. The electronic device as claimed in claim 1, wherein the actuating unit comprises a motor.

13. The electronic device as claimed in claim 1, wherein the input device and the actuating unit are arranged such that the second input interface faces inward to the housing when the actuating unit is in the first position, and the first input interface faces inward to the housing when the actuating unit is in the second position.

14. An electronic device, comprising:
a housing;
an input device, disposed on the housing, wherein the input device comprises a first input interface and a second input interface, and the first input interface and the second input interface are respectively disposed on opposite surfaces of the input device;
a sliding groove, formed on the housing;
an actuating unit, wherein the actuating unit is connected to the input device and automatically moves between a first position and a second position of the sliding groove to rotate the input device, wherein the first input interface faces outward from the housing when the actuating unit is in the first position, and the second input interface faces outward from the housing when the actuating unit is in the second position;
an abutting mechanism, a first limit element and a second limit element, wherein the first limit element is disposed on the housing and is close to the first position, the second limit element is disposed on the housing and is close to the second position, the first limit element and the second limit element abut the input device to limit movement of the input device, and the abutting mechanism is disposed in the housing to push and to rotate the input device; and
a first elastic element and a second elastic element, wherein the first elastic element pushes the actuating unit from the first position toward the second position when the second limit element releases the input device, and the second elastic element pushes the actuating unit from the second position toward the first position when the first limit element releases the input device.

15. The electronic device as claimed in claim 14, wherein the input device and the actuating unit are arranged such that the second input interface faces inward to the housing when the actuating unit is in the first position, and the first input interface faces inward to the housing when the actuating unit is in the second position.

* * * * *